United States Patent
Mok et al.

(10) Patent No.: US 12,408,508 B2
(45) Date of Patent: Sep. 2, 2025

(54) ENCAPSULATION FILM

(71) Applicant: LG CHEM, LTD., Seoul (KR)

(72) Inventors: Yeong Bong Mok, Daejeon (KR); Hyun Jee Yoo, Daejeon (KR); Jung Ok Moon, Daejeon (KR); Kyung Yul Bae, Daejeon (KR); Jung Woo Lee, Daejeon (KR); Se Woo Yang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 744 days.

(21) Appl. No.: 15/734,303

(22) PCT Filed: Jun. 5, 2019

(86) PCT No.: PCT/KR2019/006809
§ 371 (c)(1),
(2) Date: Dec. 2, 2020

(87) PCT Pub. No.: WO2019/235850
PCT Pub. Date: Dec. 12, 2019

(65) Prior Publication Data
US 2021/0226157 A1 Jul. 22, 2021

(30) Foreign Application Priority Data
Jun. 5, 2018 (KR) .................. 10-2018-0065023

(51) Int. Cl.
*H10K 50/844* (2023.01)
*B32B 7/06* (2019.01)
(Continued)

(52) U.S. Cl.
CPC ............. *H10K 50/844* (2023.02); *B32B 7/06* (2013.01); *B32B 7/12* (2013.01); *B32B 15/082* (2013.01);
(Continued)

(58) Field of Classification Search
CPC .................. H10K 50/844; H10K 50/8445
See application file for complete search history.

(56) References Cited

U.S. PATENT DOCUMENTS

2012/0326194 A1* 12/2012 Son ............. H10K 50/846
257/40
2013/0026503 A1* 1/2013 Son ............. H10K 50/8423
438/34

(Continued)

FOREIGN PATENT DOCUMENTS

| CN | 104039544 A | 9/2014 |
| CN | 104054191 | 9/2014 |

(Continued)

OTHER PUBLICATIONS

"List of thermal conductivities", Wikipedia, Mar. 22, 2010, XP055472133.

(Continued)

*Primary Examiner* — Raj R Gupta
(74) *Attorney, Agent, or Firm* — Bryan Cave Leighton Paisner LLP (57) ABSTRACT

An encapsulation film, an organic electronic device comprising the same, and a method for manufacturing the organic electronic device using the same, and the encapsulation film which forms a structure capable of blocking moisture or oxygen penetrating from the outside into the organic electronic device, effectively releases the heat accumulated in the organic electronic device, realizes endurance reliability under severe conditions of high temperature and high humidity, and prevents deterioration of the organic electronic device.

16 Claims, 1 Drawing Sheet

(51) Int. Cl.
*B32B 7/12* (2006.01)
*B32B 15/082* (2006.01)
*B32B 15/20* (2006.01)
*H10K 50/84* (2023.01)
*H10K 50/87* (2023.01)

(52) U.S. Cl.
CPC ........... *B32B 15/20* (2013.01); *H10K 50/846* (2023.02); *H10K 50/87* (2023.02); *B32B 2307/302* (2013.01); *B32B 2307/584* (2013.01); *B32B 2307/732* (2013.01); *B32B 2457/206* (2013.01)

(56) References Cited

U.S. PATENT DOCUMENTS

| | | | |
|---|---|---|---|
| 2014/0374726 A1* | 12/2014 | Goeoetz | H10K 50/856 438/26 |
| 2016/0093830 A1* | 3/2016 | Yoo | H10K 85/111 428/521 |
| 2016/0197303 A1 | 7/2016 | Goeoetz et al. | |
| 2017/0040570 A1 | 2/2017 | Kim et al. | |
| 2017/0084868 A1 | 3/2017 | Son et al. | |
| 2019/0115562 A1* | 4/2019 | Moon | B32B 15/095 |

FOREIGN PATENT DOCUMENTS

| | | |
|---|---|---|
| CN | 105247699 | 1/2016 |
| JP | 2007-041203 A | 2/2007 |
| JP | 2017-041203 A | 2/2007 |
| JP | 2011-222334 A | 11/2011 |
| JP | 2016-521909 A | 7/2016 |
| JP | 2018-506442 A | 3/2018 |
| KR | 10-2013-0014111 A | 2/2013 |
| KR | 10-1589374 B1 | 1/2016 |
| KR | 10-2017-0083792 A | 7/2017 |
| KR | 10-2018-0019153 A | 2/2018 |
| KR | 10-1829971 B1 | 2/2018 |
| KR | 10-1831153 B1 | 2/2018 |
| TW | 201804635 | 2/2018 |
| WO | 2016-205061 A1 | 12/2016 |
| WO | 2017171518 | 10/2017 |

OTHER PUBLICATIONS

Agilent Technologies, "Material Expansion Coefficients", Jan. 15, 2002, XP055814215.

* cited by examiner

ENCAPSULATION FILM

CROSS-REFERENCE TO RELATED APPLICATIONS

This application is a National Stage Application of International Application No. PCT/KR2019/006809 filed on Jun. 5, 2019, which claims the benefit of priority based on Korean Patent Application No. 10-2018-0065023 filed on Jun. 5, 2018, the disclosure of which is incorporated herein by reference in its entirety.

TECHNICAL FIELD

The present disclosure relates to an encapsulation film, an organic electronic device comprising the same, and a method for manufacturing an organic electronic device using the same.

BACKGROUND

An organic electronic device (OED) is a device comprising an organic material layer that generates alternate current of charges using holes and electrons, and an example thereof may include a photovoltaic device, a rectifier, a transmitter and an organic light emitting diode (OLED), and the like.

The organic light emitting diode (OLED) among the above organic electronic devices has less power consumption and faster response speed than existing light sources, and is advantageous for reducing thickness of a display device or a a lighting device. In addition, the OLED has spatial usability and thus is expected to be applied in various fields covering various portable devices, monitors, notebooks, and TVs.

The most important problem in commercialization and expanded application of the OLED is a durability. The organic materials and the metal electrodes, and the like included in the OLED can be easily oxidized by external factors such as moisture and if the heat generated upon driving the OLED panel is not released smoothly, the deterioration of the element due to the temperature increase is a problem. Accordingly, various methods of effectively blocking penetration of oxygen or moisture from the outside into an organic electronic device such as an OLED and effectively releasing heat generated from the OLED at the same time have been proposed.

Technical Problem

The present application provides an encapsulation film which can form a structure capable of blocking moisture or oxygen penetrating into an organic electronic device from the outside, thereby effectively releasing the heat accumulated in the organic electronic device and maintaining heat resistance durability under severe conditions such as high temperature and high humidity.

Technical Solution

The present application relates to an encapsulation film. The encapsulation film can be applied to encapsulation of an organic electronic device such as, for example, OLEDs.

In this specification, the term "organic electronic device" is an article or device having a structure comprising an organic material layer that generates alternate current of charges using holes and electrons between a pair of electrodes facing each other, and an example thereof may include, but is not limited to, a photovoltaic device, a rectifier, a transmitter and an organic light emitting diode (OLED), and the like. In one example of the present application, the organic electronic device may be an OLED.

Figure 1:
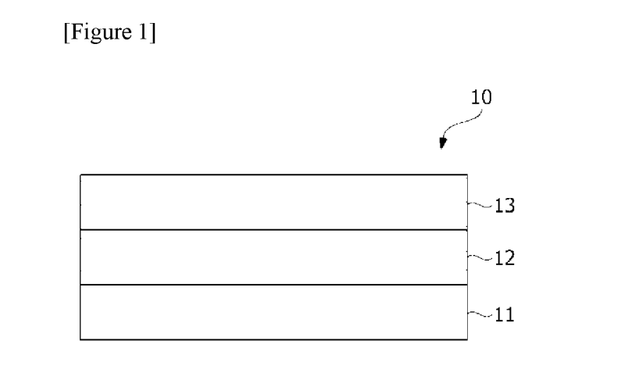
FIG. 1 is a cross-sectional view showing an encapsulation film according to one example of the present application.

An exemplary encapsulation film for an organic electronic element (10) comprises an encapsulation layer (11) for encapsulating an organic electronic element and at least two metal layers (12, 13) as shown in FIG. 1. The metal layers may be present on the encapsulation layer, but are not limited thereto. At least one layer of the metal layers may have a thermal conductivity of 50 to 800 W/m·K. Here, the encapsulation layer may encapsulate the entire surface of the organic electronic element formed on a substrate. By providing the above structure, the encapsulation film of the present application can effectively release the heat accumulated inside the organic electronic element together with the moisture barrier property, maintain the heat resistance durability under severe conditions such as high temperature and high humidity, and prevent residual images (burn-in) due to deterioration occurring in the organic electronic device. In addition, the encapsulation film of the present application comprises two or more metal layers, thereby being capable of replacing a back cover or an inner plate conventionally contained in an organic electronic device (organic electronic device without the back cover or the inner plate), such that the encapsulation film can be disposed at the outermost of the organic electronic device. That is, the present application can provide a thin organic electronic device without the back cover or the inner plate.

In one example, the metal layers and the encapsulation layer in the encapsulation film of the present application are provided as integrated. Conventionally, an encapsulation layer is first applied to an organic electronic element and then a metal layer is separately applied, whereas the encapsulation film comprising the metal layers and the encapsulation layer as integrated may be applied on an organic electronic element in the present application. The integrated encapsulation film facilitates processing convenience and minimizes alignment errors in a multilayer structure, thereby the encapsulation structure having high reliability such as dimensional stability can be realized.

An exemplary encapsulation film may comprise at least two metal layers, as described above. In addition, the metal layers may comprise, for example, a first layer having a thermal conductivity of 50 to 800 W/m·K and a second layer having a linear expansion coefficient of 20 ppm/° C. or less. The second layer may have a thermal conductivity lower than that of the first layer and the first layer may have a linear expansion coefficient higher than that of the second layer, without being limited thereto. As the encapsulation film comprises at least two or more metal layers, the present application can realize endurance reliability at a high temperature together with the heat dissipation effect. In an embodiment of the present application, the second layer may be laminated so as to face the encapsulation layer, and for example, the encapsulation layer (11), the second layer (12) and the first layer (13) may be laminated in this order.

In an embodiment of the present application, the first layer of the metal layers may have a thermal conductivity of 50 W/m·K or more, 80 W/m·K or more, 90 W/m·K or more, 100 W/m·K or more, 110 W/m·K or more, 120 W/m·K or more, 130 W/m·K or more, 140 W/m·K or more, 150 W/m·K or more, 200 W/m·K or more, or 210 W/m·K or more. The upper limit of the thermal conductivity is not particularly limited, which may be 800 W/m·K or less or 700 W/m·K or less. As described above, at least one of the metal layers has a high thermal conductivity, thereby the heat generated at a bonding interface during a metal layer bonding process can be released more quickly. Also, the high thermal conductivity rapidly releases the heat accumulated during operation of the organic electronic device, whereby the temperature of the organic electronic device itself can be kept lower, and the occurrence of cracks and defects is reduced. The thermal conductivity may be measured at any temperature ranging from 0 to 30° C.

In this specification, the term "thermal conductivity" is a degree representing capability in which a material is capable of transferring heat by conduction, where the unit may be expressed by W/m·K. The unit represents the degree to which the material transfers heat at the same temperature and distance, which means a unit of heat (watt) to a unit of distance (meter) and a unit of temperature (kellvin). In this specification, the thermal conductivity may mean the thermal conductivity measured according to ISO 22007-2.

In one example, the encapsulation film of the present application may comprise not only the first layer having the above-described thermal conductivity range but also a second layer having a low thermal conductivity relative to the first layer. By comprising at least two metal layers as above, the present application can realize the required physical properties when applied to the encapsulation of the organic electronic element as well as the thermal conductivity. For example, the second layer may have a linear expansion coefficient in a range of 20 ppm/° C. or less, 18 ppm/° C. or less, 15 ppm/° C. or less, 13 ppm/° C. or less, 9 ppm/° C. or less, 5 ppm/° C. or less, or 3 ppm/° C. or less. The lower limit of the linear expansion coefficient is not particularly limited, but may be 0 ppm/° C. or more, or 0.1 ppm/° C. or more. The present application can realize dimension stability and endurance reliability of the film in a panel driven at a high temperature by controlling the linear expansion coefficient of the second layer. The linear expansion coefficient can be measured by a standard according to ASTM E831, ASTM D696 or ISO 11359.

In an embodiment of the present application, the thickness ratio of the first layer to the second layer in the encapsulation film may be in a range of 1.0 to 40. The lower limit of the thickness ratio is not particularly limited, but may be 1.1, 1.3, 1.5, 1.8, 2.3, 2.8, 3.3, 3.8, 4.3, 4.8, 5.2, 5.8, 6.3, 6.8, 7.0, 7.1, 7.2, 7.3, 7.4 or 7.5. Also, the upper limit of the thickness ratio is not particularly limited, but may be 39, 38, 37.5, 35, 32, 30, 28, 25, 23, 20, 18, 15, 13, 10, 9, 8 or 7.8. Furthermore, in an embodiment of the present application, the thickness of the first layer may be in a range of 2 µm to 3,500 µm. The thickness lower limit of the first layer may be 4 µm, 6 µm, 10 µm, 25 µm, 35 µm, 45 µm, 100 µm, 500 µm, 1,000 µm, 1,500 µm, 2,000 µm, 2,500 µm or 2,800 µm. The thickness upper limit of the first layer may be 3,300 µm, 3,100 µm, 2,900 µm, 2,600 µm, 2,100 µm, 1,800 µm, 1,200 µm, 800 µm, 400 µm, or 90 µm. In addition, the thickness of the second layer may be in a range of 10 µm to 2,500 µm. The thickness lower limit of the second layer may be 18 µm, 25 µm, 33 µm, 43 µm, 50 µm, 70 µm, 100 µm, 500 µm, 1,000 µm, 1,500 µm or 2,000 µm, and the thickness upper limit of the second layer may be 2,300 µm, 1,800 µm, 1,300 µm, 800 µm, 400 µm or 90 µm. By adjusting the thickness ratios of the two layers, the present application can efficiently release the heat accumulated in an organic electronic device in a film applied to encapsulation of an organic electronic element and simultaneously maintain thermal durability and dimension stability under severe conditions such as high temperature and high humidity.

In an embodiment of the present application, the metal layers of the encapsulation film may be transparent and may be opaque. The total thickness of the metal layers of the multi-layered structure may be in a range of 3 µm to 6,000 µm, 10 µm to 5,500 µm, 20 µm to 5,000 µm, 30 µm to 4,500 µm or 40 µm to 4,300 µm. By controlling the thickness of the metal layers, the present application can provide an organic electronic device in the form of a thin film, while implementing sufficient heat dissipation. The metal layers may be a thin metal foil or a polymer base layer deposited with metal. The metal layer is not particularly limited as long as it satisfies the aforementioned thermal conductivity or linear expansion coefficient and is a material containing a metal. The metal layer may comprise any of a metal, a metal oxide, a metal nitride, a metal carbide, a metal oxynitride, a metal oxyboride, and a combination thereof. For example, the metal layer may comprise an alloy in which one or more metal elements or non-metal elements are added to one metal, and may comprise, for example, Invar or stainless steel (SUS). Furthermore, in one example, the metal layer may comprise iron, chromium, copper, aluminum nickel, iron oxide, chromium oxide, silicon oxide, aluminum oxide, titanium oxide, indium oxide, tin oxide, indium tin oxide, tantalum oxide, zirconium oxide, niobium oxide and a combination thereof. The metal layer may be deposited by means of electrolysis, rolling, thermal evaporation, electron beam evaporation, sputtering, reactive sputtering, chemical vapor deposition, plasma chemical vapor deposition or electron cyclotron resonance source plasma chemical vapor deposition. In one example of the present application, the metal layer may be deposited by reactive sputtering.

In an embodiment of the present application, the two or more metal layers constituting the encapsulation film may be attached by a pressure-sensitive adhesive or an adhesive. The two or more metal layers may be laminated via a pressure-sensitive adhesive or an adhesive, where the material of the pressure-sensitive adhesive or the adhesive is not particularly limited and known materials can be used. In one example, the pressure-sensitive adhesive or adhesive may be an acrylic, epoxy-based, urethane-based, silicone-based or rubber-based pressure-sensitive adhesive or adhesive. Furthermore, in one embodiment, the material of the pressure-sensitive adhesive or adhesive may be the same as or different from the material of the encapsulation layer to be described below.

Furthermore, the two or more metal layers constituting the encapsulation film may be directly attached to each other. The meaning of being directly attached herein may mean that the two layers are in contact with and attached to each other without any other layer between the two layers. As the method of directly attaching two or more metal layers, known methods in the art can be used. In one example, the two metal layers of the present application may be laminated by a method of directly welding, rolling, casting or extruding one layer of two metal layers to the other layer, and the like. In addition, the present application is not limited to the above, and a method of depositing a material of the other metal layer on one layer of the metal layers is also possible.

In an embodiment of the present application, the encapsulation layer may be formed as a single layer or a multilayer of two or more layers, and when the encapsulation layer is a multilayer of two or more layers, at least one of the metal layers may be present between the two or more layers of the encapsulation layer. For example, the above-described first layer may be provided between the two or more layers of the encapsulation layer, where the encapsulation film may have a lamination sequence of the second layer, the encapsulation layer, the first layer and the encapsulation layer, and in another example, as two or more first layers are included, it may also have a lamination sequence of the first layer, the second layer, the encapsulation layer, the first layer and the encapsulation layer.

In one example, at least one of the metal layers may have magnetism. As at least one layer of the metal layer has magnetism, it is possible to perform the process by the magnetic force, thereby further improving the process efficiency. In the present application, the second layer of the metal layers may have magnetism, without being limited thereto.

In an embodiment of the present application, as described above, the encapsulation layer may have a single layer or a multilayer structure of two or more layers. When two or more layers constitute the encapsulation layer, the compositions of the respective layers in the encapsulation layer may be the same or different. In one example, the encapsulation layer may be a pressure-sensitive adhesive layer or an adhesive layer comprising a pressure-sensitive adhesive composition or an adhesive composition.

In an embodiment of the present invention, the encapsulation layer may comprise an encapsulation resin. The encapsulation resin may comprise a crosslinkable resin or a curable resin.

In one example, the encapsulation resin may have a glass transition temperature of less than 0° C., less than –10° C., or less than –30° C., less than –50° C., or less than –60° C. Here, the glass transition temperature may be a glass transition temperature after curing, and in one embodiment, it may mean a glass transition temperature after irradiating it with ultraviolet rays having an irradiance level of about 1 J/cm$^2$ or more; or a glass transition temperature after the ultraviolet irradiation and then further performing thermosetting.

In one example, the encapsulation resin may comprise a styrene resin or elastomer, a polyolefin resin or elastomer, other elastomers, a polyoxyalkylene resin or elastomer, a polyester resin or elastomer, a polyvinyl chloride resin or elastomer, a polycarbonate resin or elastomer, a polyphenylene sulfide resin or elastomer, a mixture of hydrocarbons, a polyamide resin or elastomer, an acrylate resin or elastomer, an epoxy resin or elastomer, a silicone resin or elastomer, a fluorine resin or elastomer or a mixture thereof, and the like.

Here, as the styrene resin or elastomer, for example, styrene-ethylene-butadiene-styrene block copolymer (SEBS), styrene-isoprene-styrene block copolymer (SIS), acrylonitrile-butadiene-styrene block copolymer (ABS), acrylonitrile-styrene-acrylate block copolymer (ASA), styrene-butadiene-styrene block copolymer (SBS), styrene homopolymer or a mixture thereof can be exemplified. As the olefin resin or elastomer, for example, a high density polyethylene resin or elastomer, a low density polyethylene resin or elastomer, a polypropylene resin or elastomer or a mixture thereof can be exemplified. As the elastomer, for example, an ester thermoplastic elastomer, an olefin elastomer, a silicone elastomer, an acrylic elastomer or a mixture thereof, and the like can be used. In particular, as the olefin thermoplastic elastomer, a polybutadiene resin or elastomer or a polyisobutylene resin or elastomer, and the like can be used. As the polyoxyalkylene resin or elastomer, for example, a polyoxymethylene resin or elastomer, a polyoxyethylene resin or elastomer or a mixture thereof, and the like can be exemplified. As the polyester resin or elastomer, for example, a polyethylene terephthalate resin or elastomer, a polybutylene terephthalate resin or elastomer or a mixture thereof, and the like can be exemplified. As the polyvinyl chloride resin or elastomer, for example, polyvinylidene chloride and the like can be exemplified. As the mixture of hydrocarbons, for example, hexatriacotane or paraffin, and the like can be exemplified. As the polyamide resin or elastomer, for example, nylon and the like can be exemplified. As the acrylate resin or elastomer, for example, polybutyl (meth)acrylate and the like can be exemplified. As the epoxy resin or elastomer, for example, bisphenol types such as bisphenol A type, bisphenol F type, bisphenol S type and a hydrogenated product thereof; novolak types such as phenol novolak type or cresol novolak type; nitrogen-containing cyclic types such as triglycidyl isocyanurate type or hydantoin type; alicyclic types; aliphatic types; aromatic types such as naphthalene type and biphenyl type; glycidyl types such as glycidyl ether type, glycidyl amine type and glycidyl ester type; dicyclo types such as dicyclopentadiene type; ester types; ether ester types or a mixture thereof, and the like can be exemplified. As the silicone resin or elastomer, for example, polydimethylsiloxane and the like can be exemplified. In addition, as the fluororesin or elastomer, a polytrifluoroethylene resin or elastomer, a polytetrafluoroethylene resin or elastomer, a polychlorotrifluoroethylene resin or elastomer, a polyhexafluoropropylene resin or elastomer, polyfluorinated vinylidene, polyfluorinated vinyl, polyfluorinated ethylene propylene or a mixture thereof, and the like can be exemplified.

The resins or elastomers listed above may be also used, for example, by being grafted with maleic anhydride or the like, by being copolymerized with other resins or elastomers through monomers for producing resins or elastomers, and by being modified with other compounds. An example of other compounds above may include carboxyl-terminal butadiene-acrylonitrile copolymers and the like.

In one example, the encapsulation layer may comprise, but is not limited to, the olefin elastomer, the silicone elastomer or the acrylic elastomer, and the like among the above-mentioned types as the encapsulation resin.

In one embodiment of the present invention, the encapsulation resin may be an olefin-based resin. In one example, the olefin-based resin may be a homopolymer of a butylene monomer; a copolymer obtained by copolymerizing a butylene monomer and another polymerizable monomer; a reactive oligomer using a butylene monomer; or a mixture thereof. The butylene monomer may include, for example, 1-butene, 2-butene or isobutylene.

Other monomers polymerizable with the butylene monomers or derivatives may include, for example, isoprene, styrene, or butadiene and the like. By using the copolymer, physical properties such as processability and degree of cross-linking can be maintained and thus heat resistance of the adhesive itself can be secured when applied to organic electronic devices.

In addition, the reactive oligomer using the butylene monomer may comprise a butylene polymer having a reactive functional group. The oligomer may have a weight average molecular weight ranging from 500 to 5000. Furthermore, the butylene polymer may be coupled to another polymer having a reactive functional group. The other polymer may be, but is not limited to, alkyl (meth)acrylate. The reactive functional group may be a hydroxyl group, a carboxyl group, an isocyanate group or a nitrogen-containing group. Also, the reactive oligomer and the other polymer may be cross-linked by a multifunctional cross-linking agent, and the multifunctional cross-linking agent may be at least one selected from the group consisting of an isocyanate cross-linking agent, an epoxy cross-linking agent, an aziridine cross-linking agent and a metal chelate cross-linking agent.

In one example, the encapsulation resin of the present application may be a copolymer of a diene and an olefinic compound containing one carbon-carbon double bond. Here, the olefinic compound may include butylene or the like, and the diene may be a monomer capable of polymerizing with the olefinic compound, and may include, for example, isoprene or butadiene and the like. For example, the copolymer of an olefinic compound containing one carbon-carbon double bond and a diene may be a butyl rubber.

In the encapsulation layer, the resin or elastomer component may have a weight average molecular weight (Mw) to an extent such that the pressure-sensitive adhesive composition can be formed into a film shape. That is, the encapsulation layer may be a solid or semi-solid phase even though it is in an uncured state at room temperature. In this specification, the room temperature may mean, for example, 15° C. to 35° C. or about 25° C. In one example, the resin or elastomer may have a weight average molecular weight of about 100,000 to 2,000,000, 120,000 to 1,500,000 or 150,000 to 1,000,000 or so. The term weight average molecular weight herein means a value converted to standard polystyrene measured by GPC (gel permeation chromatograph). However, the resin or elastomer does not necessarily have the above-mentioned weight average molecular weight. For example, in the case where the molecular weight of the resin or elastomer component is not in a level enough to form a film, a separate binder resin may be blended into the pressure-sensitive adhesive composition.

In another embodiment, the encapsulation resin according to the present application is a curable resin, which may be, for example, a resin having a glass transition temperature of 85° C. or higher after curing. The glass transition temperature may be a glass transition temperature after photo-curing or thermosetting the encapsulation resin. The specific kind of the usable curable resin in the present invention is not particularly limited, and for example, various thermosetting or photo-curable resins known in this field can be used. The term "thermosetting resin" means a resin that can be cured through an appropriate heat application or aging process, and the term "photo-curable resin" means a resin that can be cured by irradiation with electromagnetic waves. Furthermore, the curable resin may be a dual curing resin including both of heat curing properties and light curing properties.

The specific kind of the curable resin in the present application is not particularly limited as long as it has the above-mentioned characteristics. For example, it may be cured to exhibit an adhesive property, which may include a resin containing one or more thermosetting functional groups such as a glycidyl group, an isocyanate group, a hydroxyl group, a carboxyl group or an amide group, or containing one or more functional groups curable by irradiation with electromagnetic waves, such as an epoxide group, a cyclic ether group, a sulfide group, an acetal group or a lactone group. A specific example of such a resin may include an acrylic resin, a polyester resin, an isocyanate resin or an epoxy resin, and the like, but is not limited thereto.

In the present application, as the curable resin, aromatic or aliphatic; or linear or branched epoxy resins may be used. In one embodiment of the present invention, an epoxy resin having an epoxy equivalent of 180 g/eq to 1,000 g/eq, which contains two or more functional groups, may be used. By using the epoxy resin having an epoxy equivalent in the above range, characteristics such as adhesion performance and glass transition temperature of the cured product can be effectively maintained. An example of such an epoxy resin may include one or a mixture of two or more of a cresol novolac epoxy resin, a bisphenol A type epoxy resin, a bisphenol A type novolak epoxy resin, a phenol novolak epoxy resin, a tetrafunctional epoxy resin, a biphenyl type epoxy resin, a triphenol methane type epoxy resin, an alkyl-modified triphenol methane epoxy resin, a naphthalene type epoxy resin, a dicyclopentadiene type epoxy resin or a dicyclopentadiene-modified phenol type epoxy resin.

In the present application, as the curable resin, an epoxy resin comprising a cyclic structure in a molecular structure can be used, and an epoxy resin comprising an aromatic group (for example, a phenyl group) can be used. When the epoxy resin comprises an aromatic group, the cured product has excellent thermal and chemical stability and simultaneously exhibits a low moisture absorption amount, whereby the reliability of the organic electronic device encapsulation structure can be improved. A specific example of the aromatic group-containing epoxy resin that can be used in the present invention may be one or a mixture of two or more of a biphenyl type epoxy resin, a dicyclopentadiene type epoxy resin, a naphthalene type epoxy resin, a dicyclopentadiene-modified phenol type epoxy resin, a cresol-based epoxy resin, a bisphenol-based epoxy resin, a xylol-based epoxy resin, a multifunctional epoxy resin, a phenol novolak epoxy resin, a triphenol methane type epoxy resin, and an alkyl-modified triphenol methane epoxy resin and the like, but is not limited thereto.

In addition, the encapsulation layer of the present application may comprise an active energy ray polymerizable compound which is highly compatible with the encapsulation resin and can form a specific cross-linked structure together with the encapsulation resin.

For example, the encapsulation layer of the present application may comprise, depending on the type of the encapsulation resin, a multifunctional active energy ray polymerizable compound that can be polymerized by irradiation of an active energy ray together with the encapsulation resin. The active energy ray polymerizable compound may mean a compound comprising two or more functional groups capable of participating in polymerization reaction by irradiation of an active energy ray, for example, functional groups containing an ethylenically unsaturated double bond such as an acryloyl group or a methacryloyl group, or functional groups such as an epoxy group or an oxetane group.

As the multifunctional active energy ray polymerizable compound, for example, a multifunctional acrylate (MFA) can be used.

Also, the active energy ray polymerizable compound may be included in an amount of 3 to 30 parts by weight, 5 to 30 parts by weight, 5 to 25 parts by weight, 8 to 20 parts by weight, 10 to 18 parts by weight or 12 to 18 parts by weight, relative to 100 parts by weight of the encapsulation resin. The present application provides an encapsulation film having excellent endurance reliability even under severe conditions such as high temperature and high humidity in the above range.

The multifunctional active energy ray polymerizable compound which can be polymerized by irradiation of the active energy ray can be used without any limitation. For example, the compound may include 1,4-butanediol di(meth)acrylate, 1,3-butylene glycol di(meth)acrylate, 1,6-hexanediol di(meth)acrylate, 1,8-octanediol di(meth)acrylate, 1,12-dodecanediol di(meth)acrylate, neopentylglycol di(meth)acrylate, dicyclopentanyl di(meth)acrylate, cyclohexane-1,4-diol di(meth)acrylate, tricyclodecanedimethanol (meth)diacrylate, dimethyloldicyclopentane di(meth)acrylate, neopentylglycol-modified trimethylol propane di(meth)acrylate, admantane di(meth)acrylate, trimethylolpropane tri(meth)acrylate, or a mixture thereof.

As the multifunctional active energy ray polymerizable compound, for example, a compound having a molecular weight of less than 1,000 and containing two or more functional groups can be used. In this case, the molecular weight may mean a weight average molecular weight or a typical molecular weight. The ring structure included in the multifunctional active energy ray polymerizable compound may be any one of a carbocyclic structure or a heterocyclic structure; or a monocyclic or polycyclic structure.

In an embodiment of the present application, the encapsulation layer may further comprise a radical initiator. The radical initiator may be a photoinitiator or a thermal initiator. The specific kind of the photoinitiator can be appropriately selected in consideration of curing rate and yellowing possibility, and the like. For example, benzoin-based, hydroxy ketone-based, amino ketone-based or phosphine oxide-based photoinitiators, and the like can be used, and specifically, benzoin, benzoin methyl ether, benzoin ethyl ether, benzoin isopropyl ether, benzoin n-butyl ether, benzoin isobutyl ether, acetophenone, dimethylamino acetophenone, 2,2-dimethoxy-2-phenylacetophenone, 2,2-diethoxy-2-phenylacetophenone, 2-hydroxy-2-methyl-1-phenylpropan-1-one, 1-hydroxycyclohexylphenyl ketone, 2-methyl-1-[4-(methylthio)phenyl]-2-morpholino-propan-1-one, 4-(2-hydroxyethoxy)phenyl-2-(hydroxy-2-propyl) ketone, benzophenone, p-phenylbenzophenone, 4,4'-diethylaminobenzophenone, diclorobenzophenone, 2-methylanthraquinone, 2-ethylanthraquinone, 2-t-butylanthraquinone, 2-aminoanthraquinone, 2-methylthioxanthone, 2-ethylthioxanthone, 2-chlorothioxanthone, 2,4-dimethylthioxanthone, 2,4-diethylthioxanthone, benzyl dimethyl ketal, acetophenone dimethyl ketal, p-dimethylaminobenzoic acid ester, oligo [2-hydroxy-2-methyl-1-[4-(1-methylvinyl)phenyl]propanone] and 2,4,6-trimethylbenzoyl-diphenyl-phosphine oxide, and the like can be used.

The radical initiator may be included in a ratio of 0.2 to 20 parts by weight, 0.5 to 18 parts by weight, 1 to 15 parts by weight, or 2 to 13 parts by weight, relative to 100 parts by weight of the active energy ray polymerizable compound. As a result, the reaction of the active energy ray polymerizable compound can be effectively induced and deterioration of the physical properties of the encapsulation layer composition due to the residual components after curing can be also prevented.

In an embodiment of the present application, it may further comprise a curing agent, depending on the kind of the resin component contained in the encapsulation layer of the encapsulation film. For example, it may further comprise a curing agent capable of reacting with the above-mentioned encapsulation resin to form a cross-linked structure or the like. In this specification, the term encapsulation resin may be used in the same sense as the resin component.

The kind of the curing agent may be appropriately selected and used depending on the type of the resin component or the functional group contained in the resin.

In one example, when the resin component is an epoxy resin, the curing agent is a curing agent of the epoxy resin known in the art, and for example, one or two or more of an amine curing agent, an imidazole curing agent, a phenol curing agent, a phosphorus curing agent or an acid anhydride curing agent, and the like can be used, without being limited thereto.

In one example, as the curing agent, an imidazole compound which is solid at room temperature and has a melting point or a decomposition temperature of 80° C. or higher can be used. As such a compound, for example, 2-methylimidazole, 2-heptadecylimidazole, 2-phenylimidazole, 2-phenyl-4-methylimidazole or 1-cyanoethyl-2-phenylimidazole, and the like may be exemplified, but is not limited thereto.

The content of the curing agent may be selected depending on composition of the composition, for example, the type or ratio of the encapsulation resin. For example, the curing agent may be contained in an amount of 1 to 20 parts by weight, 1 to 10 parts by weight or 1 to 5 parts by weight, relative to 100 parts by weight of the resin component. However, the weight ratio can be changed depending on the type and ratio of the encapsulation resin or the functional group of the resin, or the cross-linking density to be implemented, and the like.

When the resin component is a resin which can be cured by irradiation of the active energy ray, for example, a cationic photopolymerization initiator may be used as the initiator.

As the cationic photopolymerization initiator, ionized cationic initiators of onium salt organometallic salt series, or nonionized cationic photopolymerization initiators of organic silane or latent sulfonic acid series can be used. As the initiator of the onium salt series, diaryliodonium salt, triarylsulfonium salt or aryldiazonium salt, and the like can be exemplified, as the initiator of the organometallic salt series, iron arene and the like can be exemplified, as the initiator of the organosilane series, o-nitrobenzyl triaryl silyl ether, triaryl silyl peroxide or acyl silane, and the like can be exemplified, and as the initiator of the latent sulfuric acid series, α-sulfonyloxy ketone or α-hydroxymethylbenzoin sulfonate, and the like can be exemplified, without being limited thereto.

In one example, as the cationic initiator, an ionized cationic photopolymerization initiator may be used.

In one example, the encapsulation layer may further comprise a tackifier, where the tackifier may be, preferably, a hydrogenated cyclic olefin polymer. As the tackifier, for example, a hydrogenated petroleum resin obtained by hydrogenating a petroleum resin can be used. The hydrogenated petroleum resin may be partially or fully hydrogenated and may be also a mixture of such resins. Such a tackifier can be selected to have good compatibility with the pressure-sensitive adhesive composition, excellent moisture barrier property, and low organic volatile components. A specific example of the hydrogenated petroleum resin may include a hydrogenated terpene resin, a hydrogenated ester resin or a hydrogenated dicyclopentadiene resin, and the like. The tackifier may have a weight average molecular weight of about 200 to 5,000. The content of the tackifier can be appropriately adjusted as necessary. For example, the content of the tackifier may be selected in consideration of the gel content to be described below, and according to one example, it can be contained in a ratio of 5 to 100 parts by weight, 8 to 95 parts by weight, 10 to 93 parts by weight or 15 to 90 parts by weight, relative to 100 parts by weight of the resin component.

As described above, the encapsulation layer may further comprise a moisture adsorbent. In this specification, the term "moisture adsorbent" may mean a chemically reactive adsorbent capable of removing moisture or humidity, for example, through chemical reaction with the moisture or humidity that has penetrated the encapsulation film, as described below.

For example, the moisture adsorbent may be present in an evenly dispersed state in the encapsulation layer or the encapsulation film. Here, the evenly dispersed state may mean a state where the moisture adsorbent is present at the same or substantially the same density even in any portion of the encapsulation layer or the encapsulation film. The moisture adsorbent that can be used in the above may include, for example, a metal oxide, a sulfate or an organometallic oxide, and the like. Specifically, an example of the sulfate may include magnesium sulfate, sodium sulfate or nickel sulfate, and the like, and an example of the organometallic oxide may include aluminum oxide octylate and the like. Here, a specific example of the metal oxide may include phosphorus pentoxide ($P_2O_5$), lithium oxide ($Li_2O$), sodium oxide ($Na_2O$), barium oxide (BaO), calcium oxide (CaO) or magnesium oxide (MgO), and the like, and an example of the metal salt may include a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$) or nickel sulfate ($NiSO_4$), a metal halogenide such as magnesium chloride ($MgCl_2$), strontium chloride ($SrCl_2$), yttrium chloride ($YCl_3$), copper chloride ($CuCl_2$), cesium fluoride (CsF), tantalum fluoride (TaFs), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$) or magnesium iodide ($MgI_2$); or a metal chlorate such as barium perchlorate ($Ba(ClO_4)_2$) or magnesium perchlorate ($Mg(ClO_4)_2$), and the like, but is not limited thereto. As the moisture adsorbent which can be contained in the encapsulation layer, one or two or more of the above-mentioned constitutions may be also used. In one example, when two or more are used as the moisture adsorbent, calcined dolomite and the like may be used.

Such a moisture adsorbent can be controlled to an appropriate size depending on the application. In one example, the average particle size of the moisture adsorbent can be controlled to about 10 to 15,000 nm or so. The moisture adsorbent having a size within the above range has a reaction rate with moisture which is not too fast and thus is easy to store, and may do not damage the element to be encapsulated, and effectively remove moisture.

The content of the moisture adsorbent is not particularly limited, which may be suitably selected in consideration of the desired blocking characteristics.

The encapsulation layer may also comprise a moisture blocker, if desired. In this specification, the term "moisture blocker" may mean a material which has free or low reactivity with moisture, but can physically block or hinder movement of moisture or humidity within the film. As the moisture blocker, for example, one or two or more of alumina, clay, talc, needle-like silica, plate-like silica, porous silica, zeolite, titania or zirconia can be used. In addition, the moisture blocker can be surface-treated with an organic modifier or the like to facilitate penetration of organic substances. As such an organic modifier, for example, dimethyl benzyl hydrogenated tallow quaternary ammonium, dimethyl hydrogenated tallow quaternary ammonium, methyl tallow bis-2-hydroxyethyl quaternary ammonium, dimethyl hydrogenated tallow 2-ethylhexyl quaternary ammonium, dimethyl dehydrogenated tallow quaternary ammonium or a mixture thereof, and the like can be used.

The content of the moisture blocker is not particularly limited and may be suitably selected in consideration of the desired blocking characteristics.

In addition to the above-described constitutions, the encapsulation layer may comprise various additives depending on applications and the manufacturing process of the encapsulation film to be described below. For example, the encapsulation layer may comprise a curable material, a cross-linking agent, a filler or the like in an appropriate range of content depending on the intended physical properties.

In an embodiment of the present application, the encapsulation layer may be formed as a single layer structure, as described above, or may also be formed of two or more layers. When it is formed of two or more layers, the outermost layer of the encapsulation layer may not contain a moisture adsorbent or may contain a moisture adsorbent in a lower amount than the other encapsulation layer.

In one example, considering that the encapsulation film is applied to encapsulation of an organic electronic element, the content of the moisture adsorbent can be controlled in consideration of the damage of the element. For example, the layer contacting the element may comprise a small amount of moisture adsorbent, or may comprise no moisture adsorbent. In one example, the encapsulation layer in contact with the element may comprise 0 to 20% of moisture adsorbent relative to the total mass of the moisture adsorbent contained in the encapsulation film. In addition, the encapsulation layer which does not contact the element may comprise 80 to 100% of moisture adsorbent relative to the total mass of the moisture adsorbent contained in the encapsulation film.

In one example, the encapsulation film of the present application may further comprise a protective layer formed on the metal layer. The protective layer may comprise a resin component. The material constituting the protective layer is not particularly limited. In one example, the protective layer may be a moisture-proof layer capable of blocking moisture permeation. In one example, the resin component constituting the protective layer may comprise one or more selected from the group consisting of a polyorganosiloxane, a polyimide, a styrene-based resin or elastomer, a polyolefin-based resin or elastomer, a polyoxyalkylene-based resin or elastomer, a polyester-based resin or elastomer, a polyvinyl chloride-based resin or elastomer, a polycarbonate-based resin or elastomer, a polyphenylene sulfide-based resin or elastomer, a polyamide-based resin or elastomer, an acrylate-based resin or elastomer, an epoxy-based resin or elastomer, a silicone-based resin or elastomer, and a fluorine-based resin or elastomer, but is not limited thereto.

In an embodiment of the present application, it may further comprise a pressure-sensitive adhesive or an adhesive between the protective layer and the metal layer. The material of the pressure-sensitive adhesive or the adhesive is not particularly limited and known materials can be used. In one example, the pressure-sensitive adhesive or adhesive may be an acrylic, epoxy-based, urethane-based, silicone-based or rubber-based pressure-sensitive adhesive or adhesive. Furthermore, in one embodiment, the material of the pressure-sensitive adhesive or adhesive may be the same as or different from the material of the encapsulation layer as described above.

The encapsulation film may further comprise a base film or a release film (hereinafter, may be referred to as a "first film"), which may have a structure in which the encapsulation layer is formed on the base or release film. Also, the structure may further comprise a base or release film (hereinafter, may be referred to as a "second film") formed on the metal layer.

The specific kind of the first film that can be used in the present application is not particularly limited. In the present application, for example, a general polymer film in this field can be used as the first film. In the present application, for example, as the base or release film, a polyethylene terephthalate film, a polytetrafluoroethylene film, a polyethylene film, a polypropylene film, a polybutene film, a polybutadiene film, a polyvinyl chloride film, a polyurethane film, an ethylene-vinyl acetate film, an ethylene-propylene copolymer film, an ethylene-ethyl acrylate copolymer film, an ethylene-methyl acrylate copolymer film or a polyimide film, and the like can be used. In addition, a suitable mold release treatment may be performed on one side or both sides of the base film or release film of the present application. As an example of the releasing agent used in the releasing treatment of the base film, alkyd series, silicone series, fluorine series, unsaturated ester series, polyolefin series or wax series, and the like can be used, and among them, a releasing agent of alkyd series, silicone series or fluorine series is preferably used in terms of heat resistance, without being limited thereto.

In the present application, the thickness of the base film or release film (first film) as above is not particularly limited, which may be appropriately selected depending on the application to which it is applied. For example, in the present application, the thickness of the first film may be 10 μm to 500 μm, preferably, 20 μm to 200 μm or so. If the thickness is less than 10 μm, deformation of the base film may easily occur during the manufacturing process, whereas if it exceeds 500 μm, the economic efficiency is low.

The thickness of the encapsulation layer included in the encapsulation film of the present application is not particularly limited, which may be appropriately selected in accordance with the following conditions in consideration of the application to which the film is applied. The thickness of the encapsulation layer may be 5 μm to 200 μm, preferably, 5 μm to 100 μm or so. When the encapsulation layer is a multilayer, the thickness may mean the thickness of the multilayer. If the thickness of the encapsulation layer is less than 5 μm, sufficient moisture blocking ability cannot be exhibited, whereas if it exceeds 200 μm, it is difficult to secure processability, the thickness expansion due to moisture reactivity is large, so that the deposited film of the organic light emitting element may be damaged, and the economic efficiency is low.

Figure 2:
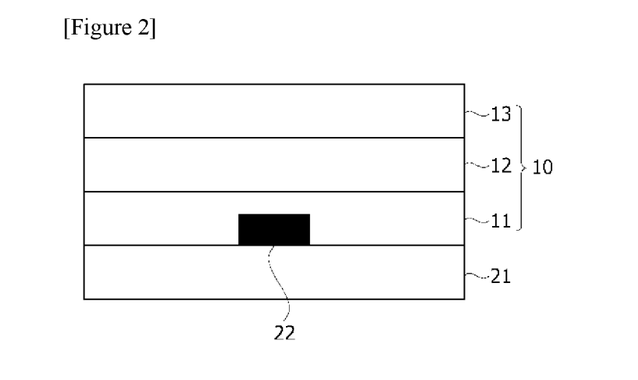
FIG. 2 is a cross-sectional view showing an organic electronic device according to one example of the present application.

The present application also relates to an organic electronic device. As shown in FIG. 2, the organic electronic device may comprise a substrate (21); an organic electronic element (22) formed on the substrate (21); and the above-described encapsulation film (10) encapsulating the entire surface of the organic electronic element (22). The encapsulation film may encapsulate the entire surface, for example, all the upper part and the side surface, of the organic electronic element formed on the substrate. The encapsulation film may comprise an encapsulation layer containing a pressure-sensitive adhesive composition or an adhesive composition in a cross-linked or cured state. Furthermore, the organic electronic device may be formed such that the encapsulation layer contacts the entire surface of the organic electronic element.

Here, the organic electronic element may be, for example, an organic light emitting element.

The encapsulation layer can be formed as a structural adhesive that efficiently fixes and supports the substrate and the metal layer while exhibiting excellent moisture barrier properties in an organic electronic device.

In addition, the encapsulation layer may be formed as a stable encapsulation layer regardless of the form of the organic electronic device such as top emission or bottom emission.

Furthermore, the organic electronic element of the present application may comprise a protective film. The protective film can prevent damage to the electrodes of the element, which may be formed of a conventional material in the technical field, and for example, may comprise SiNx or $Al_2O_3$, and the like as an inorganic material. The protective film may be a passivation film in which organic films and inorganic films are alternately deposited.

The present application also provides a method for manufacturing an organic electronic device. The manufacturing method may comprise a step of applying the above-described encapsulation film to a substrate, on which an organic electronic element is formed, so as to cover the organic electronic element. In addition, the manufacturing method may further comprise a step of curing the encapsulation film. The curing step of the encapsulation film may mean curing of the encapsulation layer, and the curing may proceed before or after the encapsulation film covers the organic electronic element.

In this specification, the term "curing" may mean that the pressure-sensitive adhesive composition of the present invention forms a cross-linked structure through heating or UV irradiation processes, and the like to be produced in the form of a pressure-sensitive adhesive. Alternatively, it may mean that the adhesive composition is solidified and attached as an adhesive.

In one example, in the manufacturing method, the organic electronic element may be formed by forming a transparent electrode on a glass or polymer film used as a substrate by a method such as vacuum evaporation or sputtering, forming a luminescent organic material layer composed of, for example, a hole transporting layer, a light emitting layer and an electron transporting layer, and the like on the transparent electrode, and then further forming an electrode layer thereon. Subsequently, the encapsulation layer of the encapsulation film may be placed to cover the entire surface of the organic electronic element of the substrate subjected to the above process.

Advantageous Effects

The encapsulation film of the present application can be applied to the sealing or encapsulation of an organic electronic device such as an OLED or the like. The film can form a structure capable of blocking moisture or oxygen introduced from the outside into the organic electronic device, thereby effectively releasing the heat accumulated in the organic electronic device, realizing endurance reliability under severe conditions of high temperature and high humidity and preventing the occurrence of deterioration of the organic electronic device.

EXPLANATION OF REFERENCE NUMERALS

10: encapsulation film
11: encapsulation layer

12: metal layer (second layer)
13: metal layer (first layer)
21: substrate
22: organic electronic element

BEST MODE

Hereinafter, the present invention will be described in more detail through examples according to the present invention and comparative examples not according to the present invention, but the scope of the present invention is not limited by the following examples.

Example 1

Production of Encapsulation Layer

A CaO (average particle diameter less than 5 μm) solution (solid content 50%) was prepared as a moisture adsorbent. Separately, a solution (solid content 50%), in which 200 g of a butyl rubber resin (BT-20, Sunwoo Chemtech) and 60 g of a DCPD petroleum resin (SU5270, Sunwoo Chemtech) were diluted with toluene, was prepared and then the solution was homogenized. 10 g of a multifunctional acrylate (trimethylolpropane triacrylate, Miwon) and 3 g of a photoinitiator (Irgacure 819, Ciba) were introduced to the homogenized solution, homogenized and then 100 g of the CaO solution was introduced thereto, followed by stirring at high speed for 1 hour to prepare an encapsulation layer solution.

The above-prepared encapsulation layer solution was applied to the release surface of a releasing PET using a comma coater and dried in a dryer at 130° C. for 3 minutes to form an encapsulation layer having a thickness of 50 μm.

Production of Encapsulation Film

The release-treated PET attached to the outside of the above-produced encapsulation layer was peeled off and roll-laminated under conditions of a temperature of 70° C. and a gap of 1 mm in order that SUS430 (second layer of metal layers, coefficient of linear expansion: 11 ppm/° C., thermal conductivity: about 25 W/m·K) with 80 μm was attached thereto. Subsequently, an aluminum foil (first layer of metal layers, thermal conductivity: 240 W/m·K) with 70 μm was roll-laminated on the second layer using a pressure-sensitive adhesive of urethane series to produce an encapsulation film that the metal layer and the encapsulation layer were laminated in this order (first layer, second layer and encapsulation layer order).

The produced encapsulation film was cut into a square sheet shape with a knife cutter through a wood cutting machine to produce a film for encapsulating an organic electronic element.

Example 2

An encapsulation film was produced in the same manner as in Example 1, except that except that the thickness of the aluminum foil (first layer of metal layers) was changed to 3 μm.

Example 3

An encapsulation film was produced in the same manner as in Example 1, except that except that the thickness of the aluminum foil (first layer of metal layers) was changed to 12 μm.

Example 4

An encapsulation film was produced in the same manner as in Example 1, except that except that the thickness of the aluminum foil (first layer of metal layers) was changed to 20 μm.

Example 5

An encapsulation film was produced in the same manner as in Example 1, except that except that the thickness of the aluminum foil (first layer of metal layers) was changed to 30 μm.

Example 6

An encapsulation film was produced in the same manner as in Example 1, except that the first layer of metal layers was a copper film (thermal conductivity: 390 W/m·K) and the thickness was changed to 3 μm.

Example 7

An encapsulation film was produced in the same manner as in Example 1, except that the first layer of metal layers was a copper film and the thickness was changed to 9 μm.

Example 8

An encapsulation film was produced in the same manner as in Example 1, except that the first layer of metal layers was a copper film and the thickness was changed to 18 μm.

Example 9

An encapsulation film was produced in the same manner as in Example 1, except that the first layer of metal layers was a copper film and the thickness was changed to 50 μm.

Example 10

In Example 1, in order to make the encapsulation layer a two-layer structure, the encapsulation layer solution was separately coated on the release PET to produce two separate encapsulation layers. Thereafter, an encapsulation film was produced in the same manner as in Example 1, except that the metal layer (second layer), the encapsulation layer, the metal layer (first layer) and the encapsulation layer were laminated in this order, and the thickness of the first layer was changed to 3 μm.

Example 11

An encapsulation film was produced in the same manner as in Example 10, except that the thickness of the first layer was changed to 5 μm.

Example 12

An encapsulation film was produced in the same manner as in Example 10, except that the thickness of the first layer was changed to 9 μm.

Example 13

An encapsulation film was produced in the same manner as in Example 1, except that the thickness of the first layer was changed to 3000 μm.

Example 14

An encapsulation film was produced in the same manner as in Example 1, except that the thickness of the first layer was changed to 3000 μm and the thickness of the second layer was changed to 2000 μm.

Example 15

An encapsulation film was produced in the same manner as in Example 1, except that the thickness of the first layer was changed to 200 μm and the thickness of the second layer was changed to 2000 μm.

Example 16

An encapsulation film was produced in the same manner as in Example 1, except that the thickness of the second layer was changed to 60 μm and the thickness of the first layer was changed to 1 μm in Example 1.

Example 17

An encapsulation film was produced in the same manner as in Example 10, except that the thickness of the second layer was changed to 60 μm in Example 1 and the thickness of the first layer was changed to 1 μm in Example 1.

Comparative Example 1

An encapsulation film was produced in the same manner as in Example 1, except that the first layer was not attached.

Comparative Example 2

In Example 1, in order to manufacture an encapsulation layer as an organic encapsulation layer with heat dissipation, a copper powder (particle diameter 3 μm) as a heat dissipation filler was introduced in an amount of 10 parts by weight relative to 100 parts by weight of a rubber resin in a rubber resin dispersion process to manufacture the manufactured encapsulation layer, and then an encapsulation film was produced in the same manner as in Example 1, except that the first layer was not attached.

Comparative Example 3

An encapsulation film was produced in the same manner as in Comparative Example 2, except that graphite (particle diameter 3 μm) was used as a heat dissipation filler.

Experimental Example 1—Measurement of Heat Dissipation Performance

A heat generating film (VOLUN WM-90-P30, size: 15 cm×25 cm, thickness: 0.25 mm) having a constant calorific value was placed on a glass (30 cm×50 cm) with a thickness of 0.7 μm at the center, the PET attached to each encapsulation layer in the encapsulation films produced in Examples and Comparative Examples was peeled off, and the encapsulation film was laminated under the conditions of a temperature of 70° C. and a gap of 1 mm such that the encapsulation layer was brought into contact with the top of the glass and the heat generating film. At this time, the temperature of the center portion of the heating film was measured.

TABLE 1

|  | Heat dissipation performance |
|---|---|
| Example 1 | 59° C. |
| Example 2 | 95° C. |
| Example 3 | 66° C. |
| Example 4 | 60° C. |
| Example 5 | 57° C. |
| Example 6 | 90° C. |
| Example 7 | 75° C. |
| Example 8 | 68° C. |
| Example 9 | 45° C. |
| Example 10 | 89° C. |
| Example 11 | 83° C. |
| Example 12 | 75° C. |
| Example 13 | 43° C. |
| Example 14 | 41° C. |
| Example 15 | 46° C. |
| Example 16 | 97° C. |
| Example 17 | 97° C. |
| Comparative Example 1 | 100° C. |
| Comparative Example 2 | 99° C. |
| Comparative Example 3 | 99° C. |

Experimental Example 2—Residual Image Measurement

Devices of organic electronic elements, to which the encapsulation films produced in Examples and Comparative Examples were attached, were manufactured in the same manner as in Experimental Example 1, except that an organic electronic element with a thickness of 0.7 μm and a panel glass (125 cm×79 cm) including circuits were used and a heat generating film was not used. At this time, the purple screen was driven at the central portion of the panel (15 cm×15 cm), and then it was confirmed whether or not residual images occurred at 85° C. after 900 hours. The results of the residual image occurrence are shown in Table 2.

TABLE 2

|  | Residual image occurrence |
|---|---|
| Example 1 | Not occurred |
| Example 2 | Not occurred |
| Example 3 | Not occurred |
| Example 4 | Not occurred |
| Example 5 | Not occurred |
| Example 6 | Not occurred |
| Example 7 | Not occurred |
| Example 8 | Not occurred |
| Example 9 | Not occurred |
| Example 10 | Not occurred |
| Example 11 | Not occurred |
| Example 12 | Not occurred |
| Example 13 | Not occurred |
| Example 14 | Not occurred |
| Example 15 | Not occurred |
| Example 16 | Some occurred |
| Example 17 | Some occurred |
| Comparative Example 1 | Occurred |
| Comparative Example 2 | Occurred |
| Comparative Example 3 | Occurred |

The invention claimed is:

1. An encapsulation film for an organic electronic element, comprising an encapsulation layer which encapsulates an organic electronic element, and two or more metal layers,
wherein the metal layers comprise a first layer having a thermal conductivity of 50 to 800 W/m·K and a second layer having a linear expansion coefficient of 20 ppm/° C. or less,
wherein the second layer has a thermal conductivity lower than that of the first layer and the first layer has a linear expansion coefficient higher than that of the second layer,
wherein the first layer and the second layer are attached to each other by a pressure-sensitive adhesive or a structural adhesive such that the first layer, the pressure-sensitive adhesive or the structural adhesive, and the second layer are sequentially laminated,
wherein the encapsulation layer, the second layer and the first layer are laminated in this order, and wherein the second layer has magnetism, and
wherein the pressure-sensitive adhesive or the structural adhesive are urethane-based pressure-sensitive adhesive or urethane-based structural adhesive.

2. The encapsulation film according to claim 1, wherein the thickness ratio of the first layer to the second layer is in a range of 1.0 to 40.

3. The encapsulation film according to claim 1, wherein the first layer has a thickness in a range of 2 μm to 3,500 μm.

4. The encapsulation film according to claim 1, wherein the second layer has a thickness in a range of 10 μm to 2,500 μm.

5. The encapsulation according to claim 1, wherein the encapsulation layer is formed of a multilayer of two or more layers.

6. The encapsulation film according to claim 1, wherein the encapsulation layer is formed of two or more layers and at least one of the metal layers is provided between the two or more layers of the encapsulation layer.

7. The encapsulation film according to claim 1, wherein the metal layers comprise any one of a metal, a metal oxide, a metal nitride, a metal carbide, a metal oxynitride, a metal oxyboride, and a formulation thereof.

8. The encapsulation film according to claim 1, wherein at least one of the metal layers has a thermal conductivity in a range of 80 to 800 W/m·K.

9. The encapsulation film according to claim 1, wherein the encapsulation layer comprises an encapsulation resin and a moisture adsorbent.

10. The encapsulation film according to claim 9, wherein the encapsulation resin comprises a curable resin or a crosslinkable resin.

11. The encapsulation film according to claim 9, wherein the moisture adsorbent is a chemically reactive adsorbent.

12. The encapsulation film according to claim 1, wherein the encapsulation layer encapsulates the entire surface of the organic electronic element formed on a substrate.

13. The encapsulation film according to claim 1, further comprising a protective layer formed on the metal layer.

14. The encapsulation film according to claim 13, wherein the protective layer comprises one or more resin components selected from the group consisting of a polyorganosiloxane, a polyimide, a styrene-based resin or elastomer, a polyolefin-based resin or elastomer, a polyoxyalkylene-based resin or elastomer, a polyester-based resin or elastomer, a polyvinyl chloride-based resin or elastomer, a polycarbonate-based resin or elastomer, a polyphenylene sulfide-based resin or elastomer, a polyamide-based resin or elastomer, an acrylate-based resin or elastomer, an epoxy-based resin or elastomer, a silicone-based resin or elastomer, and a fluorine-based resin or elastomer.

15. An organic electronic device comprising a substrate; an organic electronic element formed on the substrate; and the encapsulation film according to claim 1 for encapsulating the entire surface of the organic electronic element.

16. A method for manufacturing an organic electronic device comprising a step of applying the encapsulation film according to claim 1 to a substrate, on which an organic electronic element is formed, so as to cover the organic electronic element.

* * * * *